US006096471A

United States Patent [19]

Van Damme et al.

[11] Patent Number: 6,096,471

[45] Date of Patent: Aug. 1, 2000

[54] HEAT SENSITIVE IMAGING ELEMENT FOR PROVIDING A LITHOGRAPHIC PRINTING PLATE

[75] Inventors: Marc Van Damme, Heverlee; Huub Van Aert, Mortsel; Joan Vermeersch, Deinze, all of Belgium

[73] Assignee: Agfa-Gevaert, N.V., Mortsel, Belgium

[21] Appl. No.: 09/280,656

[22] Filed: Mar. 29, 1999

Related U.S. Application Data

[60] Provisional application No. 60/092,557, Jul. 13, 1998.

[30] Foreign Application Priority Data

May 25, 1998 [EP] European Pat. Off. .............. 98201727

[51] Int. Cl.$^7$ ...................................................... G03F 7/016

[52] U.S. Cl. ............................................ 430/188; 430/302

[58] Field of Search .................................... 430/164, 188, 430/270.1, 302

[56] References Cited

U.S. PATENT DOCUMENTS

| | | | |
|---|---|---|---|
| 5,506,085 | 4/1996 | Van Damme et al. . | |
| 5,713,287 | 2/1998 | Gelbart . | |
| 5,786,128 | 7/1998 | Vermeersch et al. | 430/302 |
| 5,816,162 | 10/1998 | Vermeersch | 101/467 |

FOREIGN PATENT DOCUMENTS

| | | |
|---|---|---|
| 0 507 008 A1 | 10/1992 | European Pat. Off. . |
| 0 771 645 A1 | 5/1997 | European Pat. Off. . |
| 1195841 | 6/1970 | United Kingdom . |
| WO 97/46385 | 12/1997 | WIPO . |

*Primary Examiner*—Janet Baxter
*Assistant Examiner*—Barbara Gilmore
*Attorney, Agent, or Firm*—Breiner & Breiner

[57] ABSTRACT

According to the present invention there is provided a heat-sensitive imaging element for providing a lithographic printing plate, comprising a support and as top layer a heat switchable image forming layer comprising a hardened hydrophilic binder and a heat switchable polymer wherein said top layer or a layer adjacent to said top layer comprises a compound capable of converting light into heat; characterized in that said heat switchable polymer is a polymer containing aryldiazosulphonate units.

10 Claims, No Drawings

HEAT SENSITIVE IMAGING ELEMENT FOR PROVIDING A LITHOGRAPHIC PRINTING PLATE

The application claims the benefit of U.S. Provisional Application Ser. No. 60/092,557 filed Jul. 13, 1998.

FIELD OF THE INVENTION

The present invention relates to a heat sensitive imaging element.

More specifically the invention is related to a heat sensitive wasteless imaging imaging element for preparing a lithographic printing plate which requires no dissolution processing.

BACKGROUND OF THE INVENTION

Lithography is the process of printing from specially prepared surfaces, some areas of which are capable of accepting lithographic ink, whereas other areas, when moistened with water, will not accept the ink. The areas which accept ink define the printing image areas and the ink-rejecting areas define the background areas.

In the art of photolithography, a photographic material is made imagewise receptive to oily or greasy inks in the photo-exposed (negative-working) or in the non-exposed areas (positive-working) on a hydrophilic background.

In the production of common lithographic printing plates, also called surface litho plates or planographic printing plates, a support that has affinity to water or obtains such affinity by chemical treatment is coated with a thin layer of a photosensitive composition. Coatings for that purpose include light-sensitive polymer layers containing diazo compounds, dichromate-sensitized hydrophilic colloids and a large variety of synthetic photopolymers. Particularly diazo-sensitized systems are widely used.

Upon imagewise exposure of the light-sensitive layer the exposed image areas become insoluble and the unexposed areas remain soluble. The plate is then developed with a suitable liquid to remove the diazonium salt or diazo resin in the unexposed areas.

Alternatively, printing plates are known that include a photosensitive coating that upon image-wise exposure is rendered soluble at the exposed areas. Subsequent development then removes the exposed areas. A typical example of such photosensitive coating is a quinone-diazide based coating.

Typically, the above described photographic materials from which the printing plates are made are exposed in contact through a photographic film that contains the image that is to be reproduced in a lithographic printing process. Such method of working is cumbersome and labor intensive. However, on the other hand, the printing plates thus obtained are of superior lithographic quality.

Attempts have thus been made to eliminate the need for a photographic film in the above process and in particular to obtain a printing plate directly from computer data representing the image to be reproduced. However the above mentioned photosensitive coatings are not sensitive enough to be directly exposed to a laser. Therefor it has been proposed to coat a silver halide layer on top of the photosensitive coating. The silver halide can then directly be exposed by means of a laser under the control of a computer. Subsequently, the silver halide layer is developed leaving a silver image on top of the photosensitive coating. That silver image then serves as a mask in an overall exposure of the photosensitive coating. After the overall exposure the silver image is removed and the photosensitive coating is developed. Such method is disclosed in for example JP-A- 60- 61 752 but has the disadvantage that a complex development and associated developing liquids are needed.

GB- 1 492 070 discloses a method wherein a metal layer or a layer containing carbon black is provided on a photosensitive coating. This metal layer is then ablated by means of a laser so that an image mask on the photosensitive layer is obtained. The photosensitive layer is then overall exposed by UV-light through the image mask. After removal of the image mask, the photosensitive layer is developed to obtain a printing plate. This method however still has the disadvantage that the image mask has to be removed prior to development of the photosensitive layer by a cumbersome processing.

Furthermore methods are known for making printing plates involving the use of imaging elements that are heat-sensitive rather than photosensitive. A particular disadvantage of photosensitive imaging elements such as described above for making a printing plate is that they have to be shielded from the light. Furthermore they have a problem of sensitivity in view of the storage stability and they show a lower dot crispness. The trend towards heat mode printing plate precursors is clearly seen on the market.

EP-A- 444 786, JP- 63-208036,and JP- 63-274592 disclose photopolymer resists that are sensitized to the near IR. So far, none has proved commercially viable and all require wet development to wash off the unexposed regions. EP-A- 514 145 describes a laser addressed plate in which heat generated by the laser exposure causes particles in the plate coating to melt and coalescence and hence change their solubility characteristics. Once again, wet development is required.

A somewhat different approach is disclosed in U.S. Pat. No. 3,787,210, U.S. Pat. No. 3,962,513, EP-A- 001 068 and JP- 04-140191. Heat generated by laser exposure of a donor sheet is used to physically transfer a resinous material from the donor to a receptor held in intimate contact with the donor. Provided the receptor surface has suitable hydrophilic properties, it can then be used as a printing plate. This method has the advantage of not requiring wet processing, but in order to achieve realistic write-times, a high power YAG (or similar) laser is required, which has restricted the usefulness of the method.

On the other hand polymer coatings which undergo a change in surface properties in response to light exposure are known in the art. WO- 92/09934 discloses imaging elements including coatings that become hydrophiliic as a result of irradiation. The coatings comprise an acid-sensitive polymer and a photochemical source of strong acid, and in both cases the preferred acid-sensitive polymer is derived from a cyclic acetal ester of acrylic or methacrylic acid, such as tetrahydropyranyl (meth)acrylate.

WO- 92/02855 discloses that the acid-sensitive polymer is blended with a low-Tg polymer to produce a coating that is initially non-tacky, but on irradiation undergoes phase separation as a result of chemical conversion of the acid-sensitive polymer, and becomes tacky. Although the possibility of laser exposure is mentioned, no details are given, and there is no disclosure of IR-sensitivity, only UV/visible. However the same materials were the subject of a paper entitled "Advances in Phototackification" presented as Paper 1912–36 at the 1993 IS & T/SPIE Conference, Symposium on Electronic Science and Technology, in which it was further disclosed that the photoacid generator could be replaced by an IR dye (specifically a squarilium dye with thiopyrylium end groups) and exposure effected with a diode laser device. The dye in question is not known to have acid-generating properties. This technology is the subject of U.S. Pat. No. 5,286,604.

WO- 92/09934 discloses that an acid-sensitive polymer is optionally blended with one or more photoacid generators. Subsequent to imagewise exposure to UV/visible radiation, the exposed areas are preferentially wettable by water, and the coatings may function as lithographic printing plates requiring no wet processing. There is no disclosure of laser adress.

WO- 92/2855 discloses that the acid-sensitive polymer is blended with a low Tg polymer to produce a coating that is initially non-tacky, but on irradiation undergoes phase separation as a result of chemical conversion of the acid-sensitive polymer, and becomes tacky. Although the possibility of laser exposure is mentioned, no details are given, and there is no disclosure of IR-sensitization, only UV/visible. However the same materials were the subject of a paper entitled "Advances in Phototackification" presented as Paper 1912–36 at the 1993 IS§T/SPIE Conference, Symposium on Electronic Science and Technology, in which it was further disclosed that the photoacid generator could be replaced by an IR dye(specifically a squarylium dye with thiopyrilium end groups) and exposure effected with a diode laser device. The dye in question is not known to have acid-generating properties. This thechnology is the subject of U.S. Pat. No. 5,288,604.

EP-A- 652 483 discloses a lithographic printing plate requiring no dissolution processing which comprises a substrate bearing a heat-sensitive coating, which coating becomes relatively more hydrophilic under the action of heat. Said system yields a positive working printing plate. An analogous system, however yielding a negative working printing plate is not known.

EP-A- 507 008 provides homopolymers and copolymers containing aryldiazosulphonate units having a maximal spectral sensitivity of at or above 320 nm. These polymers are especially suitable for the production of printing plates.

U.S. Pat. No. 5,713,287 discloses a printing plate comprising hydrophobic polymers which turn into hydrophilic polymers on heating, mixed with infra-red dyes.

GB-A- 1 195 841 discloses a thermal imaging element comprising a support and at least one layer containing a radiation to heat converting substance and a thermally degradable polumer composed of recurring units linked by azo groups.

OBJECTS OF THE INVENTION

It is an object of the invention to provide an imaging element for preparing a lithographic printing plate requiring no dissolution processing which is negative working.

It is also an object of the invention to provide an imaging element for preparing a lithographic printing plate requiring no dissolution processing which shows a good ink-uptake in the exposed areas and no scumming in the non-exposed areas.

Further objects of the invention will become clear from the description hereafter.

SUMMARY OF THE INVENTION

According to the present invention there is provided a heat-sensitive imaging element for providing a lithographic printing plate, comprising a support and as top layer a heat switchable image forming layer comprising a hardened hydrophilic binder and a heat switchable polymer wherein said top layer or a layer adjacent to said top layer comprises a compound capable of converting light into heat; characterized in that said heat switchable polymer is a polymer containing aryldiazosulphonate units.

DETAILED DESCRIPTION OF THE INVENTION

The image forming layer which becomes more hydrophobic under the influence of heat comprises a heat-switchable binder, a compound capable of transferring light into heat and a hardened hydrophilic binder. A heat-switchable binder is a polymer or copolymer which under the influence of heat undergoes a polarity transfer from hydrophilic to hydrophobic or vice versa. According to the present invention a switchable binder is used which is hydrophilic before heating and becomes hydrophobic by heating. This surface polarity difference is sufficient to prepare a classical offset printing plate. The switchable binders according to the invention are polymers or copolymers which contain aryldiazosulphonate units. A photosensitive polymer having aryldiazosulphonate units, also called aryldiazosulphonate resin, preferably is a polymer having aryldiazosulphonate units corresponding to the following formula:

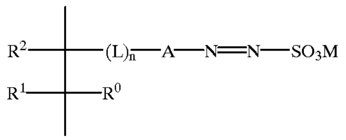

wherein $R^{0,1,2}$ each independently represent hydrogen, an alkyl group, a nitrile or a halogen, e.g. Cl, L represents a divalent linking group, n represents 0 or 1, A represents an aryl group and M represents a cation.

L preferably represents divalent linking group selected from the group consisting of:

$—(X)_t—CONR^3—$, $—(X)_t—COO—$, $—X—$ and $—(X)_t—CO—$, wherein t represents 0 or 1, $R^3$ represents hydrogen, an alkyl group or an aryl group, X represents an alkylene group, an arylene group, an alkylenoxy group, an arylenoxy group, an alkylenethio group, an arylenethio group, an alkylenamino group, an arylenamino group, oxygen, sulfur or an aminogroup.

A preferably represents an unsubstituted aryl group, e.g. an unsubstituted phenyl group or an aryl group, e.g. phenyl, substituted with one or more alkyl group, aryl group, alkoxy group, aryloxy group or amino group.

M preferably represents a cation such as $NH4^+$ or a metal ion such as a cation of Al, Cu, Zn, an alkaline earth metal or alkali metal.

A polymer having aryldiazosulphonate units is preferably obtained by radical polymerisation of a corresponding monomer. Suitable monomers for use in accordance with the present invention are disclosed in EP-A- 339 393 and EP-A- 507 008. Specific examples are:

M1

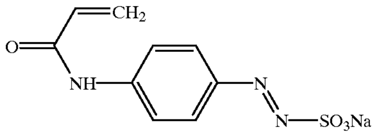

-continued
M2
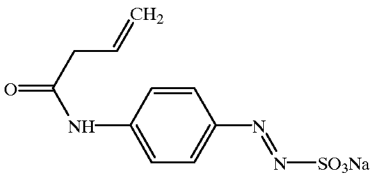
M3
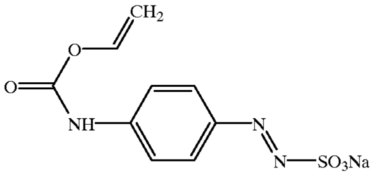
M4
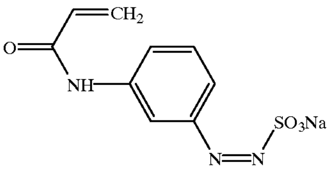
M5
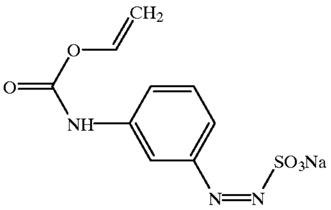
M6
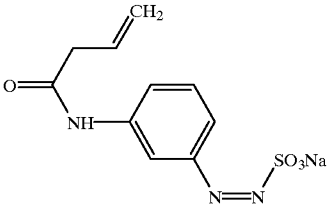
M7
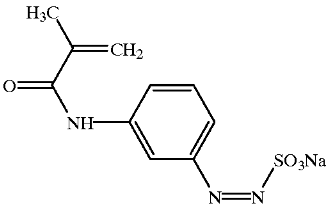
M8
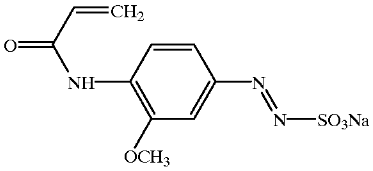
-continued
M9
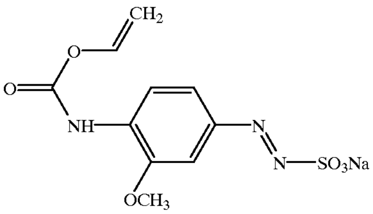
M10
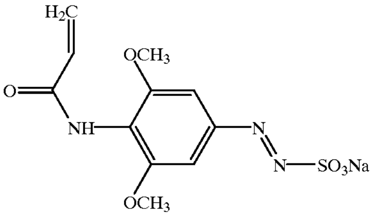
M11
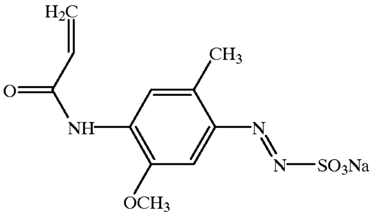
M12
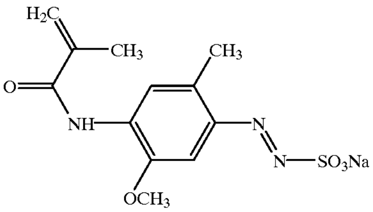
M13
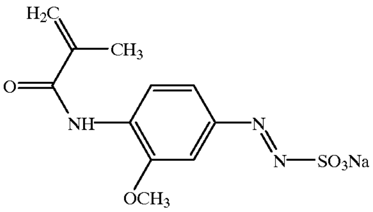
M14
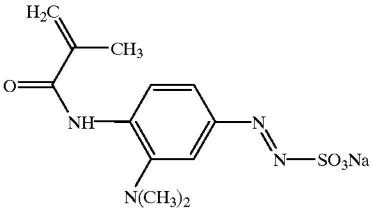

-continued

M15

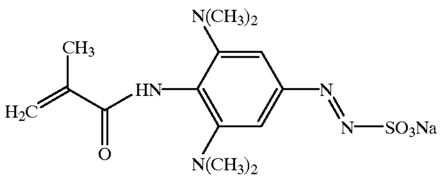

M16

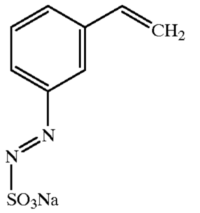

M17

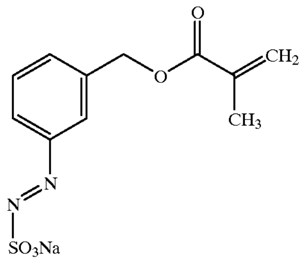

M18

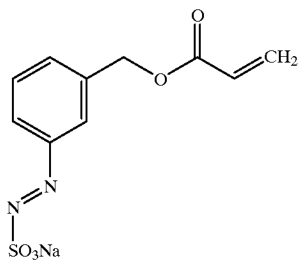

M19

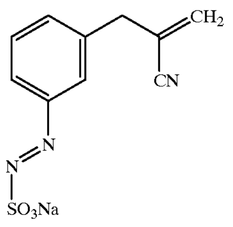

Aryldiazosulphonate monomers, e.g. as disclosed above, can be homopolymerised or copolymerised with other aryldiazosulphonate monomers and/or with vinyl monomers such as (meth)acrylic acid or esters thereof, (meth) acrylamide, acrylonitrile, vinylacetate, vinylchloride, vinylidene chloride, styrene, alpha-methyl styrene etc. In case of copolymers however, care should be taken not to impair the water solubility of the polymer. Preferably, the amount of aryldiazosulphonate comprising units in a copolymer in connection with this invention is between 10 mol % and 60 mol %.

According to another embodiment in connection with the present invention, an aryldiazosulphonate containing polymer may be prepared by reacting a polymer having e.g. acid groups or acid halide groups with an amino or hydroxy substituted aryldiazosulphonate. Further details on this procedure can be found in EP-A- 507 008.

Preferably the aryldiazosulphonate monomer is copolymerized with monomers which contain reactive groups capable of reacting with formaldehyde, glyoxal, polyisocyanates or a hydrolyzed tetraalkylorthosilicate.

The image forming layer or a layer adjacent to said layer includes a compound capable of converting light into heat. Suitable compounds capable of converting light into heat are preferably infrared absorbing components although the wavelength of absorption is not of particular importance as long as the absorption of the compound used is in the wavelength range of the light source used for image-wise exposure. Particularly useful compounds are for example dyes and in particular infrared absorbing dyes and pigments and in particular infrared absorbing pigments. Examples of infrared absorbing dyes are disclosed in EP-A- 97 203 131.4. Examples of infrared absorbing pigments are carbon black, metal carbides, borides, nitrides, carbonitrides, bronze-structured oxides and oxides structurally related to the bronze family but lacking the A component e.g. $WO_{2.9}$. It is also possible to use conductive polymer dispersion such as polypyrrole or polyaniline-based conductive polymer dispersions. Said compound capable of converting light into heat is preferably present in the top layer but can also be included in the underlying layer.

Said compound capable of converting light into heat is present in the imaging element preferably in an amount between 1 and 25% by weight of the total weight of the image forming layer, more preferably in an amount between 2 and 20% by weight of the total weight of the image forming layer.

A particularly suitable hardened hydrophilic layer may be obtained from a hydrophilic binder cross-linked with a cross-linking agent such as formaldehyde, glyoxal, polyisocyanate or a hydrolysed tetra-alkylorthosilicate. The latter is particularly preferred.

As hydrophilic binder there may be used hydrophilic (co)polymers such as for example, homopolymers and copolymers of vinyl alcohol, acrylamide, methylol acrylamide, methylol methacrylamide, acrylate acid, methacrylate acid, hydroxyethyl acrylate, hydroxyethyl methacrylate or maleic anhydride/vinylmethylether copolymers. The hydrophilicity of the (co)polymer or (co)polymer mixture used is preferably the same as or higher than the hydrophilicity of polyvinyl acetate hydrolyzed to at least an extent of 60 percent by weight, preferably 80 percent by weight.

The amount of crosslinking agent, in particular of tetraalkyl orthosilicate, is preferably at least 0.2 parts by weight per part by weight of hydrophilic binder, more preferably between 0.5 and 5 parts by weight, most preferably between 1.0 parts by weight and 3 parts by weight.

A cross-linked hydrophilic layer used in accordance with the present embodiment preferably also contains substances that increase the mechanical strength and the porosity of the layer. For this purpose colloidal silica may be used. The colloidal silica employed may be in the form of any commercially available water-dispersion of colloidal silica for example having an average particle size up to 40 nm, e.g. 20 nm. In addition inert particles of larger size than the colloidal silica may be added e.g. silica prepared according to Stöber as described in J. Colloid and Interface Sci., Vol. 26, 1968, pages 62 to 69 or alumina particles or particles having an average diameter of at least 100 nm which are particles of titanium dioxide or other heavy metal oxides. By incorporating these particles the surface of the cross-linked hydrophilic layer is given a uniform rough texture consisting of microscopic hills and valleys, which serve as storage places for water in background areas.

The image forming layer is preferably applied in an amount between 0.1 and 5 g/$m^2$, more preferably in an amount between 0.25 and 3 g/$m^2$.

The support may be as well a hydrophobic as a hydrophilic support and as well a rigid as a flexible support.

In the imaging element according to the present invention, the support can be an anodised aluminum. A particularly preferred support is an electrochemically grained and anodised aluminum support.

According to another embodiment in connection with the present invention, the support is a flexible support, such as paper or plastic film. As flexible support in connection with the present embodiment it is particularly preferred to use a plastic film e.g. substrated polyethylene terephthalate film, cellulose acetate film, polystyrene film, polycarbonate film etc. . . . The plastic film support may be opaque or transparent.

It is particularly preferred to use a polyester film support to which an adhesion improving layer has been provided. Particularly suitable adhesion improving layers for use in accordance with the present invention comprise a hydrophilic binder and colloidal silica as disclosed in EP-A- 619 524, EP-A- 620 502 and EP-A- 619 525. Preferably, the amount of silica in the adhesion improving layer is between 200 mg per $m^2$ and 750 mg per $m^2$. Further, the ratio of silica to hydrophilic binder is preferably more than 1 and the surface area of the colloidal silica is preferably at least 300 $m^2$ per gram, more preferably at least 500 $m^2$ per gram.

Between the support and the top layer the imaging element can contain other layers such as subbing layers and antihalo layers.

The imaging element can be prepared by applying the different layers according to any known technique. Alternatively said imaging element may be prepared on the press with the support already on the press by a coater or coaters placed in the immediate vicinity of the press.

Imaging in connection with the present invention is done with an image-wise scanning exposure, involving the use of a laser, more preferably of a laser that operates in the infrared or near-infrared, i.e. wavelength range of 700–1500 nm. Most preferred are laser diodes emitting in the near-infrared. Exposure of the imaging element can be performed with lasers with a short as well as with lasers with a long pixel dwell time. Preferred are lasers with a pixel dwell time between 0.005 $\mu$s and 20 $\mu$s.

After the exposure the imaging element is ready to be used as a lithographic printing plate.

In another embodiment of the invention the exposure of the imaging element can be carried out with the imaging element already on the press. A computer or other information source supplies graphics and textual information to the printhead or a laser via a lead.

The printing plate of the present invention can also be used in the printing process as a seamless sleeve printing plate. This cylindrical printing plate has such a diameter that it can be slided on the print cylinder. More details on sleeves are given in "Grafisch Nieuws" ed. Keesing, 15, 1995, page 4 to 6.

The printing plate of the present invention can also be used in the printing process as a seamless sleeve printing plate. This cylindrical printing plate which has as diameter the diameter of the print cylinder is slided on the print cylinder instead of applying in a classical way a classically formed printing plate. More details on sleeves are given in "Grafisch Nieuws" ed. Keesing, 15, 1995, page 4 to 6.

Subsequent to image-wise exposure, the image-wise exposed imaging element is mounted on a print cylinder of a printing press with the backside of the imaging element (side of the support opposite to the side having the photosensitive layer). According to a preferred embodiment, the printing press is then started and while the print cylinder with the imaging element mounted thereon rotates, the dampener rollers that supply dampening liquid and the ink rollers are dropped.

The following examples illustrate the present invention without limiting it thereto. All parts and percentages are by weight unless otherwise specified.

EXAMPLES 1

Example 1

To 11 g of a dispersion containing 21.5% TiO2 (average particle size 0.3 to 0.4 $\mu$m) and 2.5% polyvinylalcohol in deionized water were subsequently added, while stirring, 7.5 g of a solution containing 4% glyoxal in water, 33.3 g of a solution containing 1% of IR-1 in water, 12.95 g of a solution containing 6% of the diazosulphonate copolymer P20 (a copolymer containing 20 mol % of diazosulphonate monomer and 80 mol % of methyl methacrylate) in methanol and 0.30 g of a 10% solution of a wetting agent. The pH of this mixture was adjusted to pH=6.8.

The obtained dispersion was coated on a polyethylene-terephthalate film support (coated with a hydrophilic adhesion layer) to a wet coating thikness of 30 $\mu$m, dried at 30° C., and subsequently hardened by subjecting it to a temperature of 67° C. and 50% relative humidity for 12 hours.

This plate was imaged on a CREO 3244 TRENDSETTER™ (available from Creo)at 2400 dpi. operating at a drum speed of 70 rpm and a laser output of 11 Watt.

After imaging the plate was printed on a GTO46 press using Van Son Rubberbase ink and Rotamatic with 2% Tame as fountain, resulting in good prints, i.e. good ink-uptake in the exposed areas and no scumming in the non-exposed areas.

IR-1

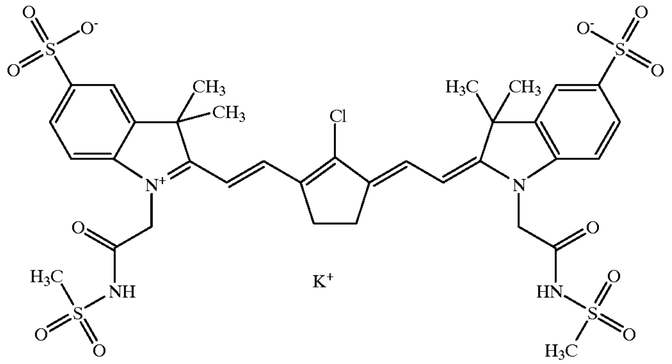

Example 2

To 22 g of a dispersion containing 21.5% TiO2 (average particle size 0.3 to 0.4 μm) and 2.5% polyvinylalcohol in deionized water were subsequently added, while stirring, 6.05 g of a solution containing 24% tetramethylorthosilicate emulsion in water, 60 g of a solution containing 1% of IR-2 in water, 12.5 g of a solution containing 5% of polyvinylalcohol in water, 30.31 g of a solution containing 6% of the diazosulphonate copolymer P20 in methanol and 0.60 g of a 10% solution of a wetting agent. The pH of this mixture as adjusted to pH=5.5.

The obtained dispersion was coated on an aluminum substrate to a wet coating thickness of 30 μm, dried at 30° C., and subsequently hardened by subjecting it to a temperature of 67° C. and 50% relative humidity for 12 hours.

This plate was imaged on a CREO 3244 TRENDSETTER™ (available from Creo)at 2400 dpi. operating at a drum speed of 50 rpm and a laser output of 11 Watt.

After imaging the plate was printed on a GTO46 press using Van Son Rubberbase ink and Rotamatic with 2% Tame as fountain, resulting in good prints, i.e. good ink-uptake in the exposed areas and no scumming in the non-exposed areas.

The reagents were obtained from Fluka and Aldrich, solvents were distilled before use.

a) preparation of 3 solutions 1 24 g sodium sulfite and 40 g sodium carbonate are dissolved in 250 ml of water 2 15,02 g of p.-aminoacetanilide are diluted in 100 ml water and 36,8 ml concentrated HCl (32%) and cooled to 0–5° C. with a cooling 5 bath.

3 6,8 g sodium nitrite are diluted in 15 ml water

Solution 3 is added dropwise to solution 2 while cooling (below 5° C.), then it is stirred for 10 minutes. After filtration the solution is poured quickly into solution 1 under intensive stirring. Then the solution is stirred for 30 minutes. The solution may be red at the beginning but the colour turns to yellow after some minutes. The solid product is filtered off from the solution and used without further purification.

b)

The product is dissolved in 150 ml water, 8 g NaOH are added, then the solution is heated to 50° C. for one hour and afterwards cooled down to 0° C. While still cooling, 19,66 ml concentrated HCl (32%) are added to the solution. Then 100 ml 1% picrinic acid and a solution of 33,6 sodium carbonate in about 350 ml water are poured into the mixture.

IR-2

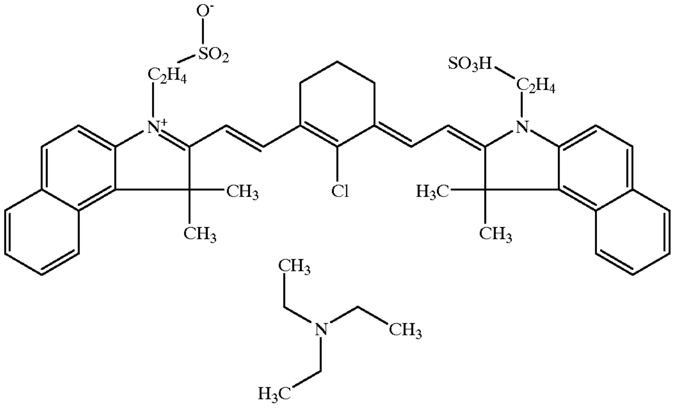

Synthesis of diazosulphonate containing polymer P20

Synthesis of monomer A

The azogroups containing substances have to be protected from light e.g. by darkening the room or wrapping the flasks with aluminum foil.

Before adding the methacrylic acid chloride the temperature of the solution has to be below 5° C. From a dropping funnel 15 ml of methacrylic acid chloride is very slowly dropped to the solution (heavy foaming). The mixture needs to be stirred for 1 hour at 0–5° C. and after that for another hour at room temperature. Then 300 ml of a saturated solution of sodium acetate are added and the solution is stored in a refrigerator (about 4° C.) overnight. The solid product is filtered and dried for 17 hours at 50° C. under vacuum. To remove inorganic salts the product is dissolved in 150 ml DMF and stirred for at least 2 hours at room temperature and filtered. For precipitation the filtrate is poured into 2 l of diethylether and then filtered. To realize a very low contents of water (2.5%) drying for three days at 50° C. under vacuum is necessary.

Synthesis of the polymer P 20

Firstly 2.11 g monomer 1 is diluted in 10 ml of water, 3.1 g methyl methacrylate and 0.300 g of azo-bis-isobutyronitrile as well as 40 ml of dioxane are added. In order to remove oxygen, the solution has to be degassed several times. Afterwards the solution (protected from light) is stirred for 17 hours at 70° C. The polymerisation is stopped by adding a small amount of hydroquinone, the solvent is evaporated and the polymer is redissolved in 80 ml methanol. The solution is dropped to 2 l of diethylether and then dried at 50° C. under vacuum over phosphor pentoxide. After drying for 3 days, one obtains a polymer with a water content of 2.5%.

We claim:

1. A heat-sensitive imaging element for providing a lithographic printing plate, comprising a support and as top layer a heat switchable image forming layer comprising a hardened hydrophilic binder and a heat switchable polymer wherein said top layer or a layer adjacent to said top layer comprises a compound capable of converting light into heat; characterized in that said heat switchable polymer is a polymer containing aryldiazosulphonate units.

2. A heat-sensitive imaging element according to claim 1 wherein the amount of aryldiazosulphonate units in said polymer is between 10 mol % and 60 mol %.

3. A heat-sensitive imaging element according to claim 1 wherein the compound capable of converting light into heat is a infrared absorbing component.

4. A heat-sensitive imaging element according to claim 3 wherein said infrared absorbing component is an infra-red absorbing dye.

5. A heat-sensitive imaging element according to claim 3 wherein said infrared absorbing component is an infra-red absorbing pigment.

6. A heat-sensitive imaging element according to claim 1 wherein said top layer comprises a cross-linking agent selected from the group consisting of formaldehyde, glyoxal, polyisocyanate or a hydrolysed tetra-alkylorthosilicate.

7. A heat-sensitive imaging element according to claim 1 wherein said top layer comprises a hydrophilic binder selected from the group consisting of homopolymers and copolymers of vinyl alcohol, acrylamide, methylol acrylamide, methylol methacrylamide, acrylate acid, methacrylate acid, hydroxyethyl acrylate, hydroxyethyl methacrylate or maleic anhydride/vinylmethylether copolymers.

8. A heat-sensitive imaging element according to claim 1 wherein said aryldiazosulphonate monomer is copolymerized with monomers which contain reactive groups capable of reacting with formaldehyde, glyoxal, polyisocyanates or a hydrolyzed tetraalkylorthosilicate.

9. A method for providing a lithographic printing plate comprising the step of exposing a heat-sensitive imaging element according to claim 1.

10. A method for printing which consist of the following steps exposing a heat-sensitive imaging element according to claim 1;

mounting the plate on the press applying ink and fountain solution on the plate; and printing from said plate.

* * * * *